United States Patent [19]

Henderson

[11] 4,148,969
[45] Apr. 10, 1979

[54] POLYPARABANIC ACID/COPPER FOIL LAMINATES OBTAINED BY DIRECT SOLUTION CASTING

[75] Inventor: Don J. Henderson, Worthington, Ohio

[73] Assignee: Exxon Research & Engineering Co., Florham Park, N.J.

[21] Appl. No.: 832,760

[22] Filed: Sep. 12, 1977

Related U.S. Application Data

[63] Continuation of Ser. No. 663,596, Mar. 3, 1976, abandoned.

[51] Int. Cl.$^2$ .............................................. B32B 15/08
[52] U.S. Cl. .............................. 428/458; 427/388 R; 427/96; 427/195; 156/331
[58] Field of Search ............... 427/388 D, 388 R, 195, 427/96; 428/458, 461; 260/77.5 R, 77.5 CH, 32.6 N; 156/331

[56] References Cited

U.S. PATENT DOCUMENTS

| | | | |
|---|---|---|---|
| 3,547,897 | 12/1970 | Patton | 260/77.5 R |
| 3,591,562 | 7/1971 | Patton | 260/77.5 R |
| 3,635,905 | 1/1972 | Patton | 260/77.5 R |
| 3,661,859 | 5/1972 | Patton | 260/77.5 CH |
| 3,682,960 | 8/1972 | Haller | 260/32.6 N |
| 3,684,773 | 8/1972 | Patton | 260/77.5 R |
| 3,732,185 | 5/1973 | Hocker et al. | 260/77.5 CH |
| 3,821,018 | 6/1974 | Grant | 427/377 |
| 3,835,121 | 9/1974 | Preston | 260/77.5 R |
| 3,953,626 | 4/1976 | Suzuki et al. | 427/358 X |

*Primary Examiner*—Ralph S. Kendall
*Attorney, Agent, or Firm*—D. A. Roth; M. B. Kurtzman

[57] ABSTRACT

This invention relates to processes and techniques for forming metal and/or plastic/polyparabanic acid (PPA) laminates particularly for use as a component of electrical and electronic systems, especially as flexible circuit materials. Laminate species not requiring intermediate adhesive layers, not fabricated from preformed PPA films and not requiring subsequent cross-linking or other curing reactions are preferred. Solvent casting of PPA is a preferred method of preparing such laminates.

11 Claims, No Drawings

POLYPARABANIC ACID/COPPER FOIL LAMINATES OBTAINED BY DIRECT SOLUTION CASTING

This is a continuation, of application Ser. No. 663,596, filed Mar. 3, 1976, abandoned.

CROSS REFERENCES TO RELATED APPLICATIONS

This application is not formally related to any other application owned by the same assignee except to the extent that polyparabanic acid materials are described in and claimed in several other patents. Moreover, there is a copending, commonly assigned patent application Ser. No. 397,646 in which coatings and films are made from polyparabanic acid powders, as opposed to solutions.

BACKGROUND OF THE INVENTION

There is a strong existing need for flexible printed circuit (FPC) materials which have good electrical insulating properties, good mechanical properties, and high temperature dimensional stability to enable them to withstand soldering operations above 400° F., preferably as high as 500° F.

It is known in the prior art that various polyimide films can be adhesively bonded to copper foil to form such FPC articles. Nevertheless, the requirement of an adhesive layer adds an expensive and difficult process requirement. Moreover, the adhesive layer is the weakest link in the overall laminate. Therefore, such laminates suffer from important temperature limitations, which adversely affect significant characteristics, such as bond strength, dimensional stability, environmental stability, and chemical stability.

Another alternative taught by the art, see e.g., U.S. Pat. No. 3,682,960 is to use solutions of polyamic acids and/or amide-modified polyamic acids as intermediates which are soluble in certain solvents such as dimethylformamide. These solutions are then coated on various metal substrates such as copper sheets, copper foil, copper wire, etc. Subsequently, it is required that the coated substrate be exposed to the precisely proper temperature or free radical environment conditions necessary to achieve full cyclization without cross-linking or without inadequate cyclization.

Improved cyclized polymers adhering to the surface of a metal foil, which is to be used as a flexible printed circuit suffer from the adverse characteristic of lacking flexibility and foldability, which are the sine qua non of a flexible printed circuit.

The very existence of a flexible printed circuit market is strongly indicative of the market place demand of a printed circuit which is flexible enough to be stuffed, jammed, wrapped, poked into what would ordinarily be inaccessable areas. FPC's which have been prepared from improperly cyclized films will not stand up under these conditions, nearly as well as the FPC articles according to the present invention.

SUMMARY OF THE INVENTION

Essentially non-cross-linked polyparabanic acids/metallic laminates with the PPA coating adhered to the metal substrate without an intermediate adhesive layer and without the necessity for extensive cross-linking. Copper is the preferred metal and metal foil is the preferred shape of the metallic portion of the composite.

DESCRIPTION OF THE INVENTION WITH PREFERRED EMBODIMENTS

Novel and unobvious PPA/metal composite laminates are prepared according to the invention which are especially useful for preparing flexible printed circuits (FPC) which will withstand high soldering temperatures without distortion or delamination. The process of preparing such high-performance laminates composites is considerably less expensive than comparably known processes to the art as is the resulting composite, since it offers high performance coupled with relatively low polymer costs. Therefore, the composites of the invention are especially useful because of the combination of excellent properties and low cost which is not hitherto known.

The novel composition of the invention is achieved through processing by preferably:

(1) direct solution casting of PPA polymer from a volatile solvent onto copper foil, or
(2) hot compression molding of PPA powder onto copper, or
(3) direct heat lamination of thermoplastic PPA film to copper.

It is significant that satisfactory adhesion of PPA to copper can be achieved by using commercially available clean, high purity copper foils (as are common for FPC) without additional surface pretreatments. Known coating or film casting techniques and equipment can be employed. It is of course recognized that copper surface cleanliness and preparation will have a major influence on the resulting PPA-copper bond strength and temperature characteristics. Likewise, inorganic and organic primers applied to the copper surface before coating will affect bond properties.

It has also been found that the exact drying conditions of the cast PPA layer affects adhesion between the PPA and copper. Drying ovens blanketed with nitrogen are useful to prevent oxidation of the copper. In general, processing conditions found to maximize PPA cast film properties also maximize the properties of PPA when coated directly on copper. It is important to note that the PPA polymers used in these coatings are fully formed and further chemical modification i.e., cross-linking does not need to be performed during the coating process as is necessary in the art of many "high temperature" polymer films and coatings. Cyclization is also not necessary.

The PPA layer can be modified by any suitable technique for flame retardation, stabilization, reinforcement, blending, foaming, and plasticization.

In certain situations adhesion can be improved by mixing into the PPA formulation or coating on the metal foil various adhesion promoters or coupling agents such as silanes as is known in the art. At least 25% of the PPA resin must be of an aromatic type, however, it need not be a homopolymer but may consist of copolymers with PPA or blends of PPA polymers.

The thickness of the layers will be determined by the particular end-use contemplated. Typically the PPA layer is in the range of 0.1 to 8 mils (preferably 1 to 5 mils), and typically the copper layer is from ½ to 10 mils. Thicker coatings may be built up by applying several thinner layers and drying between applications. Likewise, structures coated on more than one side or of alternating PPA and copper layers can be prepared.

Polyparabanic acids have been described in several issued patents by the common assignee. Illustrative are U.S. Pat. Nos. 3,547,897 and 3,661,859 both of which patents are incorporated herein by reference in their entirety.

For the purpose of this invention the molecular weight of the utilizable polyparabanic acids can vary over a wide range. The lower limit is determined by that molecular weight which will form an integral supported coating on the surface of a metallic substrate.

Normally, this coating will be hard and relatively nonscratchable to the touch and the fingernail.

Nevertheless, upon occasion it might be desired to use such a coating as an intermediate layer upon which other films can be laminated. Thus a relatively low molecular weight tacky PPA coating on a metallic laminate can be subsequently covered with a continuous film of kapton, which is the DuPont polyimide film, this can be then laminated to the copper by direct heat lamination. Since the intermediate PPA material has excellent high temperature properties, this intermediate adhesive offers the advantage of being considerably heat stable at higher temperatures than the ordinarily employed intermediate adhesives.

The general solution viscosities are 1,000 to 50,000 centipoises (cps, Brookfield viscosity), preferred 5,000 to 40,000, most preferred 10,000 to 20,000.

The inherent viscosity of the PPA polymer should be in the range of 0.4 to 2.5, more preferably 0.6 to 2.0, most preferably 0.8 to 1.2.

Viscosities of less than 0.4 tend to give brittle substrates.

But the intermediate adhesive layer, if utilized can employ PPA polymers having inherent viscosities of less than 0.4 preferably at least 0.05.

Polymers having an inherent viscosity of less than 0.4 form brittle layers, which are unsuitable except as intermediate adhesives. Brittleness is evidenced by inability to resist finger creasing without cracking.

The polyimide of polyimide-amide films of the prior art which require a heat reaction actually undergo a cyclization reaction which is accompanied by random cross-linking. This requires a critical control of temperature and other conditions to make sure that the total reaction is not overdone or underdone. If either one of these extremes is encountered, the resulting coatings will be unsatisfactory for use as FPC materials.

The invention will be further illustrated by the following examples:

EXAMPLE I

PPA prepared from the hydrolyzed reaction product of diphenylmethane diisocyanate with hydrogen cyanide (designated PPA-M) was dissolved in dimethylformamide to give a 17.0%, 20,000 vis. sol. Two-ounce (0.0028 inch thich) copper foil (Hi-Bond, Anaconda, American Brass Company) was coated, as received, on the matt side with a 13-mil wet coating, and then heated at 204° C. for eight minutes in a nitrogen atmosphere. This laminate was subsequently dried in a circulating air oven for one hour at 250° C. to give a 3-mil PPA coating on the copper.

The product laminate was tough, flexible, and creasable without delamination or cracking. The structure was unaffected when immersed for 15 seconds in a 260° C. solder bath.

EXAMPLE II

Using the coating procedure of Example I, 2 oz. copper was coated with PPA-M (inherent viscosity 0.83) from a 15% solution in N-methyl-2-pyrrolidone. The coating was dried at 235° C. for eight minutes.

The resulting product had a smooth surface and excellent physical properties. The PPA layer could not be peeled from the copper.

EXAMPLE III

A continuous roll of PPA-M/copper laminate was prepared in commercial type equipment using a reverse roll coater as solution applicator and in-line drying ovens. The resulting laminate was batch dried at temperatures up to 300° C. to remove last traces of DMF.

This dry laminate was used to prepare sample flexible printed circuits by chemical etching techniques.

EXAMPLE IV

PPA-M powder was hot compression molded on copper foil to give 3/16 PPA layer. The resulting structure had good properties with the copper layer adequately adhered.

What is claimed is:

1. A process of forming flexible coated articles of polyparabanic acid strongly adhered to a supportive copper substrate which comprises in combination the steps of:
   (a) forming a solution of polyparabanic acid with an inherent viscosity of 0.4-2.5 having a viscosity of from 1,000 to 50,000 cps, Brookfield viscosity, at least 25% of the polyparabanic acid being of an aromatic type,
   (b) coating a thin layer of said solution directly on a copper substrate in the absence of intermediate adhesives,
   (c) heating said thin layer of polyparabanic acid solution to evaporate said solvent from said film and
   (d) recovering a flexible coated article having a relatively dry layer of polyparabanic acid strongly adhered directly to said copper substrate.

2. The process of claim 1 wherein said substrate is copper foil.

3. The process of claim 1, wherein said polyparabanic acid layer has a thickness of 0.1-8 mils and said copper foil has a thickness of ½-10 mils.

4. The article produced by the process of claim 3.

5. The process of claim 1 wherein the inherent viscosity of the polyparabanic acid polymer is from 0.6-2.0.

6. The article produced by the process of claim 5.

7. A coated article suitable as a precursor for a laminate article comprising one component of the ultimate laminate coated with a layer of polyparabanic acid having an inherent viscosity of at least 0.05 but less than 0.4 wherein at least 25% of the polyparabanic acid is of an aromatic type.

8. The article of claim 7 wherein said coated component is metallic copper.

9. The article of claim 8 wherein said copper is copper foil.

10. Coated articles comprising copper coated with a polyparabanic acid having an inherent viscosity in the range of about 0.4 to about 2.5 and wherein at least 25% of the polyparabanic acid is of an aromatic type.

11. The article of claim 10 wherein said copper is copper foil.

* * * * *

UNITED STATES PATENT OFFICE
CERTIFICATE OF CORRECTION

Patent No. 4,148,969     Dated April 10, 1979

Inventor(s) Don J. Henderson

It is certified that error appears in the above-identified patent and that said Letters Patent are hereby corrected as shown below:

Column 1, line 6, between the word "abandoned" and the period (.) please insert the phrase ---, which is a continuation of application Ser. No. 464,359, filed April 26, 1974, abandoned---.

Signed and Sealed this

Ninth Day of October 1979

[SEAL]

Attest:

RUTH C. MASON
Attesting Officer

LUTRELLE F. PARKER
Acting Commissioner of Patents and Trademarks